US012687782B2

United States Patent

(12) United States Patent
Kimura et al.
(10) Patent No.: US 12,687,782 B2
(45) Date of Patent: Jul. 21, 2026

(54) RESIST UNDERLAYER FILM-FORMING COMPOSITION COMPRISING FLUOROALKYL GROUP-CONTAINING ORGANIC ACID OR SALT THEREOF

(71) Applicant: NISSAN CHEMICAL CORPORATION, Tokyo (JP)

(72) Inventors: Tetsuya Kimura, Toyama (JP); Hirokazu Nishimaki, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 571 days.

(21) Appl. No.: 18/028,984

(22) PCT Filed: Sep. 22, 2021

(86) PCT No.: PCT/JP2021/034844
§ 371 (c)(1),
(2) Date: Mar. 28, 2023

(87) PCT Pub. No.: WO2022/065374
PCT Pub. Date: Mar. 31, 2022

(65) Prior Publication Data
US 2023/0333474 A1 Oct. 19, 2023

(30) Foreign Application Priority Data
Sep. 28, 2020 (JP) ................................ 2020-162603
Sep. 28, 2020 (JP) ................................ 2020-162630

(51) Int. Cl.
*G03F 7/11* (2006.01)
*H10P 76/20* (2026.01)
*H10P 76/40* (2026.01)

(52) U.S. Cl.
CPC ............ *G03F 7/11* (2013.01); *H10P 76/2042* (2026.01); *H10P 76/4085* (2026.01)

(58) Field of Classification Search
CPC ... G03F 7/11; G03F 7/091; G03F 7/26; H01L 21/0275; H01L 21/0337; H01L 21/027; H10P 76/2042; H10P 76/4085; H10P 76/00
USPC ... 430/5, 311, 327, 330, 271.1, 270.1, 272.1
See application file for complete search history.

(56) References Cited

U.S. PATENT DOCUMENTS

| | | | |
|---|---|---|---|
| 6,284,428 | B1 | 9/2001 | Hirosaki et al. |
| 2015/0378260 | A1 | 12/2015 | Endo et al. |
| 2016/0314991 | A1 | 10/2016 | Ogihara et al. |
| 2018/0162968 | A1 | 6/2018 | Kinzie et al. |
| 2020/0142310 | A1 | 5/2020 | Saito et al. |
| 2020/0387072 | A1 | 12/2020 | Nishimaki et al. |
| 2021/0311396 | A1 | 10/2021 | Ogata et al. |

FOREIGN PATENT DOCUMENTS

| | | | |
|---|---|---|---|
| JP | 2000-221689 | A | 8/2000 |
| JP | 2009-175436 | A | 8/2009 |
| JP | 2010-237491 | A | 10/2010 |
| JP | 2016-206500 | A | 12/2016 |
| JP | 2018-095855 | A | 6/2018 |
| WO | 2014/129582 | A1 | 8/2014 |
| WO | 2019/013293 | A1 | 1/2019 |
| WO | 2019/163834 | A1 | 8/2019 |
| WO | 2020/026834 | A1 | 2/2020 |

OTHER PUBLICATIONS

Dec. 14, 2021 International Search Report issued in International Patent Application No. PCT/JP2021/034844.
Dec. 14, 2021 Written Opinion of the International Searching Authority issued in International Patent Application No. PCT/JP2021/034844.
May 29, 2025 Office Action issued in Taiwanese Patent Application No. 110135191.
Feb. 14, 2025 Office Action issued in Taiwanese Patent Application No. 110135191.
Apr. 1, 2025 Office Action issued in Korean Patent Application No. 10-2023-7011212.
May 20, 2026 Office Action issued in Japanese Patent Application No. 2022-552038.

*Primary Examiner* — Caleen O Sullivan
(74) *Attorney, Agent, or Firm* — Oliff PLC

(57) ABSTRACT

A lithographic process for the production of a semiconductor device has recently caused a problem in terms of generation of a sublime component (sublimate) derived from a low-molecular-weight compound (e.g., polymer resin, crosslinking agent, or crosslinking catalyst) during baking upon formation of a resist underlayer film from a resist underlayer film-forming composition. The resist underlayer film-forming composition of the present invention uses an organic acid having a fluoroalkyl group or an organic acid salt having a fluoroalkyl group, as a crosslinking catalyst, and thus the resist underlayer film-forming composition containing the crosslinking catalyst can effectively prevent generation of a sublimate derived from a low-molecular-weight component contained in the resist underlayer film during formation of the film.

16 Claims, No Drawings

RESIST UNDERLAYER FILM-FORMING COMPOSITION COMPRISING FLUOROALKYL GROUP-CONTAINING ORGANIC ACID OR SALT THEREOF

TECHNICAL FIELD

The present invention relates to a crosslinking catalyst for a resist underlayer film-forming composition effective for processing of a semiconductor substrate, a resist underlayer film-forming composition containing the crosslinking catalyst, a method for forming a resist pattern using the resist underlayer film-forming composition, and a method for producing a semiconductor device.

BACKGROUND ART

Fine processing by lithography using a photoresist composition has been conventionally performed in the production of semiconductor devices. The fine processing is a processing method involving formation of a thin film of a photoresist composition on a to-be-processed substrate (e.g., silicon wafer); irradiation of the thin film with active rays (e.g., ultraviolet rays) through a mask pattern having a semiconductor device pattern drawn thereon; development of the irradiated thin film; and etching of the to-be-processed substrate (e.g., silicon wafer) with the resultant photoresist pattern serving as a protective film. In recent years, active rays having a shorter wavelength have tended to be used (i.e., shifting from KrF excimer laser (248 nm) to ArF excimer laser (193 nm)) in association with an increase in the degree of integration of semiconductor devices. The use of such active rays having a shorter wavelength causes a serious problem in terms of the influence of diffused reflection of active rays from a substrate or the influence of standing wave. In order to avoid such a problem, there has been widely used a method involving providing a resist underlayer film called anti-reflective coating (Bottom Anti-Reflective Coating, BARC) between a photoresist and a to-be-processed substrate. A lithographic technique using extreme ultraviolet rays (EUV, 13.5 nm) or electron beams (EB) as active rays has been developed for the purpose of finer processing. In general, EUV lithography or EB lithography does not require a specific anti-reflective coating because of no occurrence of standing wave or diffused reflection from a substrate in such a technique. Meanwhile, a resist underlayer film has been extensively studied as an auxiliary film for the purpose of improving the resolution or adhesion of a resist pattern.

In general, such a resist underlayer film formed between a photoresist and a to-be-processed substrate is formed as described below, in order to prevent mixing of the resist underlayer film and the resist disposed above the underlayer film. Specifically, a resist underlayer film-forming composition is applied onto the to-be-processed substrate, and then subjected to a baking process, to thereby form the resist underlayer film as a thermosetting crosslinked film that does not cause mixing with the resist. In order to form such a thermosetting film, the resist underlayer film-forming composition generally contains a polymer resin as an essential component, as well as a crosslinkable compound (crosslinking agent) and a catalyst for promoting crosslinking reaction (crosslinking catalyst). In particular, the crosslinking catalyst to be mainly used is a thermal acid generator, such as a sulfonic acid compound, a carboxylic acid compound, or a sulfonic acid ester.

In recent years, a lithographic process for the production of a semiconductor device has caused a new problem in terms of generation of a sublime component (sublimate) derived from a low-molecular-weight compound (e.g., the aforementioned polymer resin, crosslinking agent, or crosslinking catalyst) during baking upon formation of a resist underlayer film from the aforementioned resist underlayer film-forming composition. In the semiconductor device production process, such a sublimate may be deposited and accumulated in a film formation apparatus to contaminate the interior of the apparatus, and may be eventually deposited as foreign matter on a wafer, to thereby cause defects, etc. Thus, demand has arisen for a proposal of a new underlayer film-forming composition capable of preventing generation of such a sublimate from a resist underlayer film as much as possible, and attempts have been made to provide such a resist underlayer film exhibiting low sublimation property (see, for example, Patent Documents 1 and 2).

PRIOR ART DOCUMENTS

Patent Documents

Patent Document 1: JP 2009-175436 A
Patent Document 2: JP 2010-237491 A
Patent Document 3: WO 2014/129582

SUMMARY OF THE INVENTION

Problems to be Solved by the Invention

The generation of such a sublimate is due to the fact that an arylsulfonic acid salt (e.g., pyridinium-p-toluenesulfonate), which is a thermal acid generator widely used as a crosslinking catalyst for a resist underlayer film-forming composition, exhibits neutrality or weak acidity in the resist underlayer film-forming composition, and is also due to the fact that thermal decomposition is required for generation of a strong acid necessary for the crosslinking reaction. Thus, when the generation efficiency for an acid that acts as a catalyst for the crosslinking reaction, is low at the formation temperature (baking temperature) of the resist underlayer film, in such an arylsulfonic acid salt, the crosslinking reaction does not proceed sufficiently, which is likely to cause sublimation of a low-molecular-weight compound.

The present invention has been accomplished for solving the aforementioned problems. An object of the present invention is to provide a resist underlayer film-forming composition containing a crosslinking catalyst for a resist underlayer film-forming composition that effectively reduces the amount of a sublimate; a resist underlayer film formed from the resist underlayer film-forming composition; a method for forming a resist pattern using the resist underlayer film-forming composition; and a method for producing a semiconductor device.

Means for Solving the Problems

A first aspect of the present invention is a resist underlayer film-forming composition comprising an acid catalyst A, wherein the acid catalyst A is an organic acid having a fluoroalkyl group or an organic acid salt having a fluoroalkyl group.

A second aspect of the present invention is the resist underlayer film-forming composition according to the first aspect, wherein the acid catalyst A is an organic acid or an organic acid salt having three or more fluorine atoms in one molecule.

A third aspect of the present invention is the resist underlayer film-forming composition according to the first or second aspect, wherein the acid catalyst A is a sulfonic acid or a sulfonic acid salt.

A fourth aspect of the present invention is the resist underlayer film-forming composition according to any one of the first to third aspects, wherein the organic acid salt having a fluoroalkyl group is a pyridinium salt.

A fifth aspect of the present invention is the resist underlayer film-forming composition according to any one of the first to fourth aspects, wherein the acid catalyst A is a trifluoromethanesulfonic acid or a trifluoromethanesulfonic acid salt.

A sixth aspect of the present invention is the resist underlayer film-forming composition according to any one of the first to fifth aspects, wherein the composition further comprises an acid catalyst B, and the acid catalyst B is an arylsulfonic acid salt compound having a hydroxy group of the following Formula (1):

Formula (1)

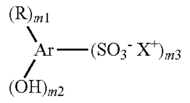

(wherein Ar is an aromatic carbon ring, and the aromatic carbon ring is a benzene ring or a polycondensed ring composed of condensed benzene rings; R is each a substituent of a hydrogen atom on the aromatic carbon ring, and is a nitro group, an amino group, a carboxyl group, a halogen atom, a $C_{1-10}$ alkoxy group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group composed of any combination of these; m1 is an integer of 0 to (2+2n); m2 and m3 are each an integer of 1 to (3+2n); (m1+m2+m3) is an integer of 2 to (4+2n); the number of benzene rings of the polycondensed ring is an integer of 2 to 6; and $X^+$ is $NH_4^+$, a primary ammonium ion, a secondary ammonium ion, a tertiary ammonium ion, a quaternary ammonium ion, a sulfonium ion, or an iodonium cation).

A seventh aspect of the present invention is the resist underlayer film-forming composition according to the sixth aspect, wherein Ar is a benzene ring.

An eighth aspect of the present invention is the resist underlayer film-forming composition according to the sixth or seventh aspect, wherein $X^+$ is an ammonium ion.

A ninth aspect of the present invention is the resist underlayer film-forming composition according to any one of the sixth to eighth aspects, wherein R is a methyl group or a carboxyl group.

A tenth aspect of the present invention is the resist underlayer film-forming composition according to any one of the sixth to ninth aspects, wherein m1 is 0, and m2 and m3 are each 1.

An eleventh aspect of the present invention is the resist underlayer film-forming composition according to any one of the first to tenth aspects, wherein the composition further comprises a crosslinking agent.

A twelfth aspect of the present invention is a resist underlayer film formed from the resist underlayer film-forming composition according to any one of the first to eleventh aspects.

A thirteenth aspect of the present invention is a method for forming a resist pattern used for semiconductor production, the method comprising a step of applying the resist underlayer film-forming composition according to any one of the first to eleventh aspects onto a semiconductor substrate, and a step of baking the composition to thereby form a resist underlayer film.

A fourteenth aspect of the present invention is the method for forming a resist pattern according to the thirteenth aspect, wherein the step of baking is a two-stage baking step in which the composition is baked at 250° C. or lower, and then heated to a temperature higher than 250° C. and further baked.

A fifteenth aspect of the present invention is a method for producing a semiconductor device comprising a step of forming, on a semiconductor substrate, a resist underlayer film from the resist underlayer film-forming composition according to any one of the first to eleventh aspects; a step of forming a resist film on the resist underlayer film; a step of irradiating the resist film with light or electron beams, and then developing the resist film, to thereby form a resist pattern; a step of etching the resist underlayer film with the formed resist pattern; and a step of processing the semiconductor substrate with the patterned resist underlayer film.

A sixteenth aspect of the present invention is a method for producing a semiconductor device comprising a step of forming, on a semiconductor substrate, a resist underlayer film from the resist underlayer film-forming composition according to any one of the first to eleventh aspects; a step of forming a hard mask on the resist underlayer film; a step of forming a resist film on the hard mask; a step of irradiating the resist film with light or electron beams, and then developing the resist film, to thereby form a resist pattern; a step of etching the hard mask with the formed resist pattern; a step of etching the resist underlayer film with the patterned hard mask; and a step of processing the semiconductor substrate with the patterned resist underlayer film.

Effects of the Invention

The resist underlayer film-forming composition of the present invention contains, as a crosslinking catalyst, an organic acid containing fluorine atoms in the molecule or a salt of the organic acid. Since the crosslinking catalyst of the present invention contained in the resist underlayer film-forming composition contains fluorine atoms in the molecule, when a resist underlayer film is formed from the resist underlayer film-forming composition, the fluorine atoms migrate toward the surface of the film, and the crosslinking reaction in the baking step is promoted at the film surface even at a low temperature. Thus, the resist underlayer film-forming composition can effectively prevent generation of a sublimate derived from a low-molecular-weight component contained in the resist underlayer film during formation of the film. When the resist underlayer film-forming composition of the present invention contains, besides the organic acid containing fluorine atoms in the molecule or a salt of the organic acid, an arylsulfonic acid salt compound having a hydroxy group of Formula (1) as a crosslinking catalyst, the generation of a sublimate derived from a low-molecular-weight component contained in the resist underlayer film can be further effectively prevented during formation of the film in the baking step within a wide temperature range (from low to high temperatures).

According to the resist underlayer film of the present invention, generation of a sublimate can be prevented during formation of the resist underlayer film from the resist underlayer film-forming composition, and redeposition of the sublimate onto the formed resist underlayer film can also be prevented. Thus, occurrence of defects in the resist underlayer film, which may be caused by the sublimate, can be suppressed.

When the resist underlayer film-forming composition is applied onto an uneven substrate, the resist underlayer film of the present invention (flat resist underlayer film) can be formed on the uneven substrate regardless of an open area (non-patterned area) or a patterned area of DENSE (dense) and ISO (coarse) on the substrate.

The method for forming a resist pattern of the present invention can form a photoresist pattern having a favorable shape.

The method for producing a semiconductor device of the present invention can effectively prevent generation of a sublimate derived from a low-molecular-weight component contained in the resist underlayer film during formation of the film. Thus, the present invention can prevent contamination of the interior of the film formation apparatus with the sublimate, as well as occurrence of defects, etc. in the semiconductor device due to deposition of the sublimate (as foreign matter) on the wafer.

MODES FOR CARRYING OUT THE INVENTION

In the present invention, the resist underlayer film-forming composition contains a polymer, a crosslinking catalyst, and a solvent. The crosslinking catalyst contains an acid catalyst A, or the crosslinking catalyst contains an acid catalyst B besides the acid catalyst A. The composition may contain a crosslinking agent, and, if necessary, may contain an additive such as an acid generator or a surfactant.

The composition has a solid content of 0.1 to 70% by mass, or 0.1 to 60% by mass. The "solid content" as used herein corresponds to the total amount of all components of the resist underlayer film-forming composition, except for the amount of the solvent. The amount of the polymer in the solid content may be 1 to 99.9% by mass, or 50 to 99.9% by mass, or 50 to 95% by mass, or 50 to 90% by mass.

[Acid Catalyst A]

The resist underlayer film-forming composition of the present invention contains, as an acid catalyst A, an organic acid having a fluoroalkyl group or an organic acid salt having a fluoroalkyl group.

The organic acid having a fluoroalkyl group or the organic acid salt having a fluoroalkyl group is prepared through substitution of one or more fluorine atoms in the molecule.

Examples of the organic acid having a fluoroalkyl group include fluoroacetic acids such as monofluoroacetic acid, difluoroacetic acid, and trifluoroacetic acid; and perfluoroalkylsulfonic acids such as trifluoromethanesulfonic acid, nonafluorobutanesulfonic acid, pentafluoroethanesulfonic acid, and heptafluoropropanesulfonic acid.

Of these, an organic acid containing a large number of fluorine atoms is preferred, and trifluoromethanesulfonic acid is preferred, from the viewpoint of the surface mobility of the atoms in a film.

Examples of the organic acid salt having a fluoroalkyl group include an inorganic salt, an organic amine salt, and an onium salt of the aforementioned acids.

Examples of the inorganic salt include perfluoroalkylsulfonic acid salts, such as potassium trifluoromethanesulfonate, lithium trifluoromethanesulfonate, potassium nonafluorobutanesulfonate, lithium nonafluorobutanesulfonate, potassium pentafluoroethanesulfonate, and potassium heptafluoropropanesulfonate.

Examples of the onium salt include a sulfonium salt, an iodonium salt, and a tetrahydrothiophenium salt.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, and 4-methanesulfonylphenyldiphenylsulfonium 2-bicyclo[2.2.1]hept-2-yl-1,1,2,2-tetrafluoroethanesulfonate.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, and bis(4-t-butylphenyl)iodonium 2-bicyclo[2.2.1]hept-2-yl-1,1,2,2-tetrafluoroethanesulfonate.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, and 1-(3,5-dimethyl-4-hydroxyphenyl)tetrahydrothiophenium 2-bicyclo[2.2.1]hept-2-yl-1,1,2,2-tetrafluoroethanesulfonate.

Examples of the organic amine salt include diethylammonium trifluoromethanesulfonate, triethylammonium trifluoromethanesulfonate, diisopropylammonium trifluoromethanesulfonate, ethyldiisopropylammonium trifluoromethanesulfonate, diphenylammonium trifluoromethanesulfonate, imidazolium trifluoromethanesulfonate, and pyridinium trifluoromethanesulfonate.

Of these salts, an organic amine salt is preferred, an alkylamine salt or a pyridine salt is preferred, and pyridinium trifluoromethanesulfonate is preferred, from the viewpoint of solubility in a solvent, etc.

[Acid Catalyst B]

The resist underlayer film-forming composition of the present invention further contains, as an acid catalyst B, an arylsulfonic acid salt compound having a hydroxy group of the following Formula (1).

Formula (1)

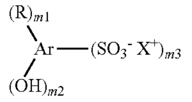

In the arylsulfonic acid salt compound having a hydroxy group of Formula (1), Ar is an aromatic carbon ring, and the aromatic carbon ring is a benzene ring or a polycondensed ring composed of condensed benzene rings; R is each a substituent of a hydrogen atom on the aromatic carbon ring, and is a nitro group, an amino group, a carboxyl group, a halogen atom, a $C_{1-10}$ alkoxy group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group composed of any combination of these; m1 is an integer of 0 to (2+2n); m2 and m3 are each an integer of 1 to (3+2n); (m1+m2+m3) is an integer of 2 to (4+2n); the number of benzene rings of the polycondensed ring is an integer of 2 to 6; and $X^+$ is $NH_4^+$, a primary ammonium ion, a secondary ammonium ion, a tertiary ammonium ion, a quaternary ammonium ion, a sulfonium ion, or an iodonium cation).

Examples of the aforementioned $C_{1-10}$ alkoxy group include methoxy group, ethoxy group, n-propoxy group, i-propoxy group, n-butoxy group, i-butoxy group, s-butoxy group, t-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group.

Examples of the aforementioned $C_{1-10}$ alkyl group include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group. 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the aforementioned $C_{2-10}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyi group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyi group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the aforementioned $C_{6-40}$ aryl group include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenyl group, m-biphenyl group, p-biphenyl group, 1-anthryl group, 2-anthryl group, 9-anthryl group, 1-phenanthryl group, 2-phenanthryl group, 3-phenanthryl group, 4-phenanthryl group, 9-phenanthryl group, and pyrenyl group.

The organic group containing an ether bond may be shown by $R^{21}$—O—$R^{21}$ (wherein $R^{31}$ is each independently a $C_{1-6}$ alkyl group such as a methyl group or an ethyl group, an alkylene group, a phenyl group, or a phenylene group), and is, for example, an ether-bond-containing organic group containing a methoxy group, an ethoxy group, or a phenoxy group.

The organic group containing a ketone bond may be shown by $R^{31}$—C(=O)—$R^{31}$ (wherein $R^{31}$ is each independently a $C_{1-6}$ alkyl group such as a methyl group or an ethyl group, an alkylene group, a phenyl group, or a phenylene group), and is, for example, a ketone-bond-containing organic group containing an acetoxy group or a benzoyl group. The organic group containing an ester bond may be shown by $R^{41}$—C(=O)—$R^{41}$ (wherein $R^{41}$ is each independently a $C_{1-6}$ alkyl group such as a methyl group or an ethyl group, an alkylene group, a phenyl group, or a phenylene group), and is, for example, an organic group containing an ester bond such as methyl ester, ethyl ester, or phenyl ester.

Examples of the aforementioned halogen atom include a fluorine atom, a chlorine atom, a bromine atom, and an iodine atom.

Examples of the sulfonic acid compound serving as an anionic moiety of the acid catalyst B of Formula (1) include p-phenolsulfonic acid, o-cresol-4-sulfonic acid, p-cresol-2-sulfonic acid, 2-chloro-p-phenolsulfonic acid, 2-cyano-p-phenolsulfonic acid, 5-sulfosalicylic acid, 1,2-dihydroxybenzene-4-sulfonic acid, 1,2-dihydroxybenzene-4,5-disulfonic acid, 2-methoxy-p-phenolsulfonic acid, 2-methoxycarbonyl-p-phenolsulfonic acid, 1-methoxybenzene-4-sulfonic acid, 1-naphthol-4-sulfonic acid, 1-naphthol-5-sulfonic acid, 2-naphthol-6-sulfonic acid, 2-naphthol-7-sulfonic acid, 2,3-dihydroxynaphthalene-6-sulfonic acid, 2-hydroxynaphthalene-3,6-disulfonic acid, 2,7-dihydroxynaphthalene-3,6-disulfonic acid, and 2-hydroxyanthracene-7-sulfonic acid. Preferred are p-phenolsulfonic acid, o-cresol-4-sulfonic acid, and 5-sulfosalicylic acid.

The cationic moiety $X^+$ of the acid catalyst B of Formula (1) is $NH_4^+$, a primary ammonium ion, a secondary ammonium ion, a tertiary ammonium ion, a quaternary ammonium ion, a sulfonium ion, or an iodonium cation. Preferred are a primary ammonium ion, a secondary ammonium ion, a tertiary ammonium ion, and a quaternary ammonium ion, and particularly preferred are a secondary ammonium ion and a tertiary ammonium ion.

Examples of the primary ammonium ion include primary ammonium ions derived from, for example, methylamine, ethylamine, n-propylamine, n-butylamine, aniline, and dimethylaniline.

Examples of the secondary ammonium ion include secondary ammonium ions derived from, for example, dimethylamine, diethylamine, n-dipropylamine, diisopropylamine, n-dibutylamine, pyrrolidine, piperidine, morpholine, 3,5-dimethylmorpholine, 2,6-dimethylpiperidine, and methylaminoethanol.

Examples of the tertiary ammonium ion include tertiary ammonium ions derived from, for example, trimethylamine, triethylamine, n-tripropylamine, diisopropylethylamine, n-tributylamine, 1-methylpyrrolidine, 1-methylpiperidine, 1-ethylpiperidine, 4-methylmorpholine, 4-ethylmorpholine, dimethylaminoethanol, diethylaminoethanol, methyldiethanolamine, ethyldiethanolamine, pyridine, 4-methylpyridine, 2,6-dimethylpyridine, 2,4,6-trimethylpyridine, and quinoline.

Examples of the quaternary ammonium ion include quaternary ammonium ions such as tetramethylammonium, tetraethylammonium, tetra-n-propylammonium, tetra-n-butylammonium, benzyltetramethylammoniurn, and benzyltetraethylammonium.

Examples of the sulfonium ion include sulfonium ions such as trimethylsulfonium, triethylsulfonium, phenyldimethylsulfonium, diphenylmethylsulfonium, and triphenylsulfonium.

Examples of the iodonium cation include iodonium cations such as diphenyliodonium and bis(4-tert-butylphenyl) iodonium.

Preferred are cations derived from pyridine, 4-methylpyridine, n-tripropylamine, morpholine, and 4-methylmorpholine.

Examples of the acid catalyst B of Formula (1) include compounds of the following Formulae (2-1) to (2-27).

Formula (2-1)

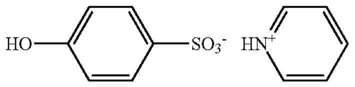

Formula (2-2)

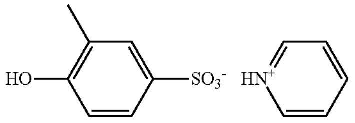

Formula (2-3)

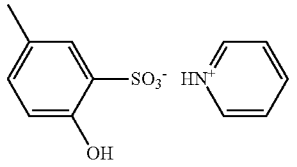

Formula (2-4)

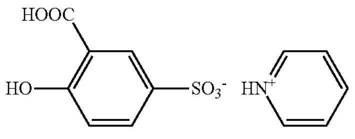

Formula (2-5)

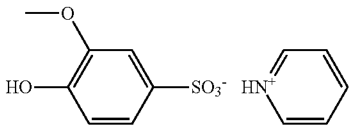

Formula (2-6)

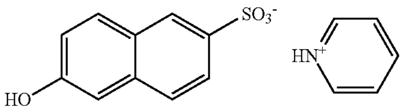

-continued

Formula (2-7)

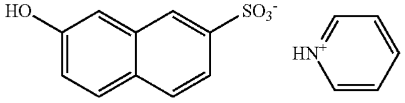

Formula (2-8)

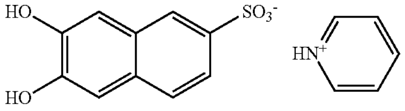

Formula (2-9)

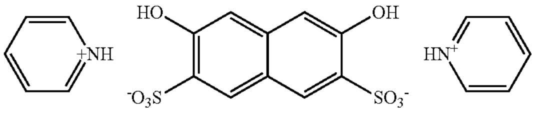

Formula (2-10)

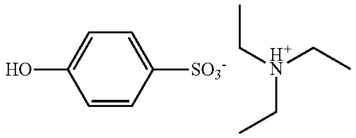

Formula (2-11)

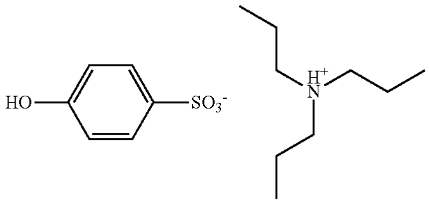

Formula (2-12)

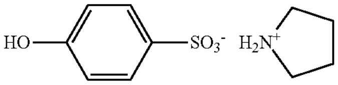

Formula (2-13)

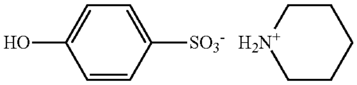

Formula (2-14)

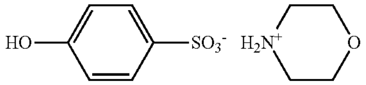

Formula (2-15)

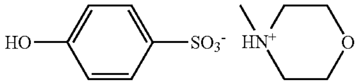

Formula (2-16)

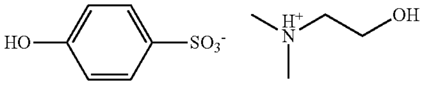

Formula (2-17)

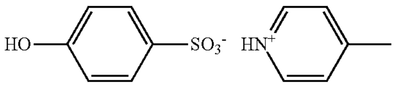

Formula (2-18)

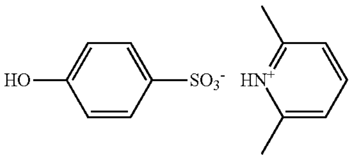

Formula (2-19)

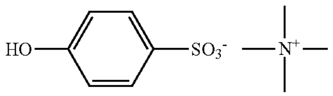

-continued

Formula (2-20)

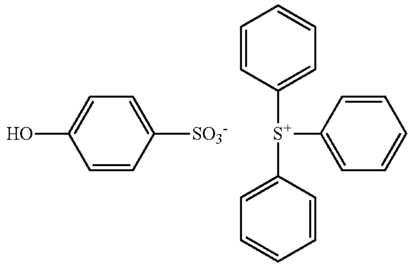

Formula (2-21)

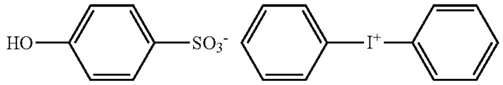

Formula (2-22)

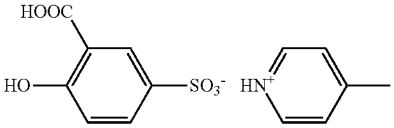

Formula (2-23)

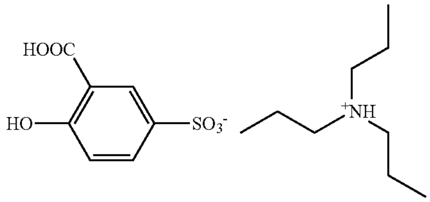

Formula (2-24)

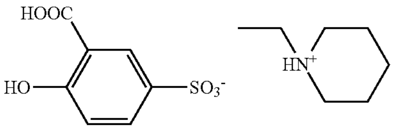

Formula (2-25)

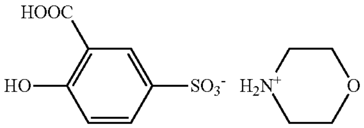

Formula (2-26)

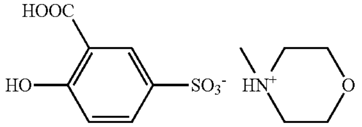

Formula (2-27)

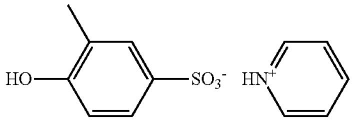

In the present invention, the catalyst for promoting the aforementioned crosslinking reaction may contain, besides the acid catalysts A and B described above, an acidic compound such as p-toluenesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, or naphthalenecarboxylic acid, and/or a thermal acid generator such as 2,4,4,6-tetrabromocyclohexadienone, benzoin tosylate, 2-nitrobenzyl tosylate, or other organic sulfonic acid alkyl esters, or a halogen-containing compound-based photoacid generator such as phenyl-bis(trichloromethyl)-s- triazine, or a sulfonic acid-based photoacid generator such as benzoin tosylate or N-hydroxysuccinimide trifluoromethanesulfonate, in combination. The amount of the acid catalyst is 0.0001 to 20% by mass, preferably 0.0005 to 10% by mass, more preferably 0.01 to 3% by mass, relative to the total solid content.

[Polymer Resin]

The polymer resin contained in the resist underlayer film-forming composition of the present invention is a polymer resin composed of, for example, any of a novolac resin, a polyester resin, a polyimide resin, and an acrylic resin, or any combination of these.

The polymer used in the present invention has a weight average molecular weight of 600 to 1,000,000 or 600 to 200,000.

Such a polymer is, for example, a polymer containing a unit structure (A) of the following Formula (2).

Formula (2)

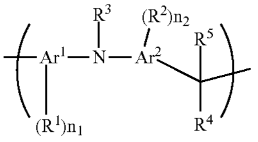

The polymer used in the present invention has a weight average molecular weight of 600 to 1,000,000 or 600 to 200,000.

The polymer used in the present invention contains a repeating unit structure (A) of Formula (2).

In Formula (2), each of $Ar^1$ and $Ar^2$ is a benzene ring or a naphthalene ring; each of $R^1$ and $R^2$ is a substituent of a hydrogen atom on the corresponding ring, and is selected from the group consisting of a halogen atom, a nitro group, an amino group, a hydroxy group, a $C_{1-10}$ alkyl group, a $C_{2-10}$ alkenyl group, a $C_{6-40}$ aryl group, and any combination of these; and each of the alkyl group, the alkenyl group, and the aryl group is an organic group that may contain an ether bond, a ketone bond, or an ester bond.

$R^3$ is selected from the group consisting of a hydrogen atom, a $C_{1-10}$ alkyl group, a $C_{2-10}$ alkenyl group, a $C_{6-40}$ aryl group, and any combination of these; and each of the alkyl group, the alkenyl group, and the aryl group is an organic group that may contain an ether bond, a ketone bond, or an ester bond.

$R^4$ is selected from the group consisting of a $C_{6-40}$ aryl group and a heterocyclic group; and each of the aryl group and the heterocyclic group is an organic group substitutable with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxy group.

$R^5$ is selected from the group consisting of a hydrogen atom, a $C_{1-10}$ alkyl group, a $C_{6-40}$ aryl group, and a heterocyclic group; each of the alkyl group, the aryl group, and the heterocyclic group is an organic group substitutable with a halogen atom, a nitro group, an amino group, or a hydroxy group; $R^4$ and $R^5$ may form a ring together with the carbon atom to which they are bonded; and each of $n_1$ and $n_2$ is an integer of 0 to 3.

The $C_{1-10}$ alkyl group, the $C_{2-10}$ alkenyl group, the $C_{6-40}$ aryl group, the $C_{1-10}$ alkoxy group, and the halogen atom may be the same as those exemplified above.

The aforementioned heterocyclic group is preferably an organic group composed of a 5- or 6-membered heterocyclic ring containing nitrogen, sulfur, or oxygen. Examples of the heterocyclic group include a pyrrole group, a furan group, a thiophene group, an imidazole group, an oxazole group, a thiazole group, a pyrazole group, an isoxazole group, an isothiazole group, and a pyridine group.

In particular, a heterocyclic group containing sulfur is preferred from the viewpoint of use in a material of high refractive index.

In the unit structure (A) of Formula (2). $R^5$ may be a hydrogen atom, and $R^4$ may be a substitutable phenyl group, naphthyl group, anthryl group, or pyrenyl group. In the unit structure (A) of Formula (2), $R^3$ may be a hydrogen atom or a phenyl group.

In the present invention, the unit structure (A) may be a unit structure (a1) wherein one of $Ar^1$ and $Ar^2$ is a benzene ring, and the other is a naphthalene ring. Alternatively, the unit structure (A) may be a unit structure (a2) wherein both $Ar^1$ and $Ar^2$ are a benzene ring.

The polymer of the present invention may be a copolymer containing the aforementioned unit structure (a1) and unit structure (a2).

Alternatively, the polymer of the present invention may be a copolymer containing the unit structure (A) of Formula (2) and a unit structure (B) of the following Formula (3).

Formula (3)

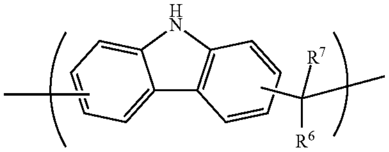

In the aforementioned unit structure (B), $R^6$ is selected from the group consisting of a $C_{6-40}$ aryl group and a heterocyclic group; and each of the aryl group and the heterocyclic group is an organic group substitutable with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxy group; $R^7$ is selected from the group consisting of a hydrogen atom, a $C_{1-10}$ alkyl group, a $C_{6-40}$ aryl group, and a heterocyclic group, and each of the alkyl group, the aryl group, and the heterocyclic group is an organic group substitutable with a halogen atom, a nitro group, an amino group, or a hydroxy group; and $R^6$ and $R^7$ may form a ring together with the carbon atom to which they are bonded.

These substituents, alkyl group, aryl group, and heterocyclic group may be the same as those exemplified above.

The polymer of the present invention may be a copolymer containing the aforementioned unit structure (a1) and unit structure (B).

Examples of the polymer used in the present invention include those described below.

Formula (3-1)

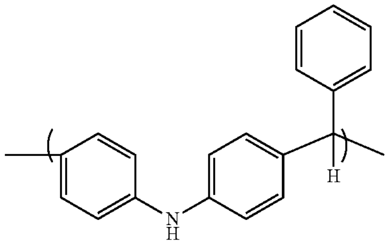

-continued
Formula (3-2)
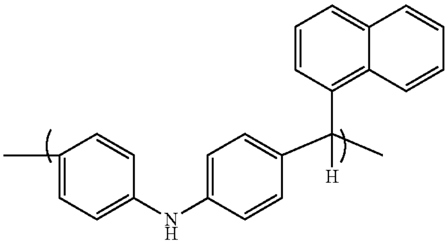
Formula (3-3)
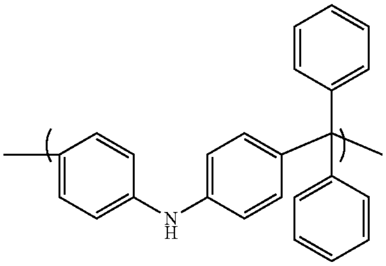
Formula (3-4)
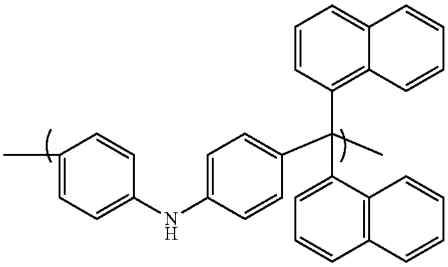
Formula (3-5)
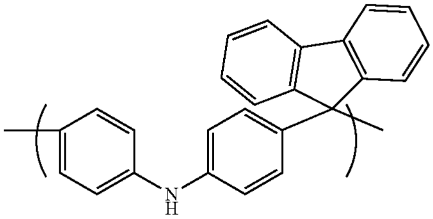
Formula (3-8)
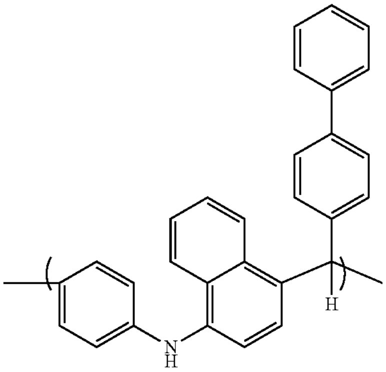
-continued
Formula (3-9)
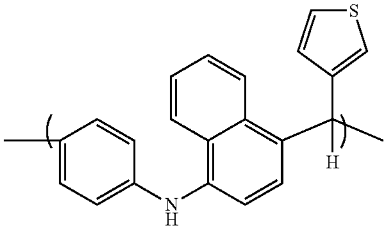
Formula (3-10)
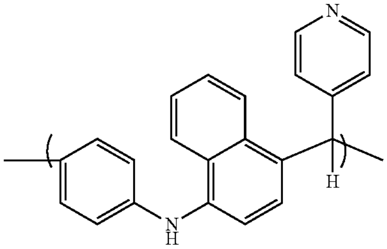
Formula (3-11)
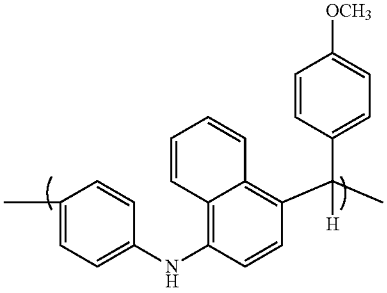
Formula (3-12)
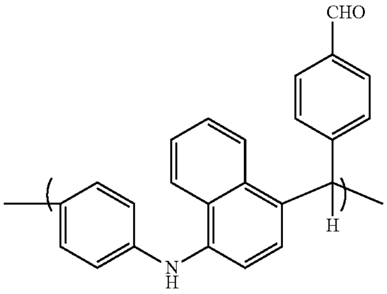
Formula (3-13)
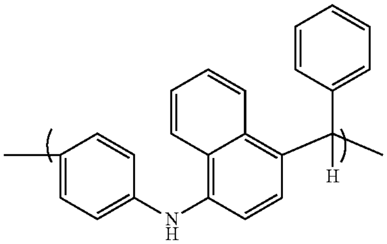
Formula (3-14)
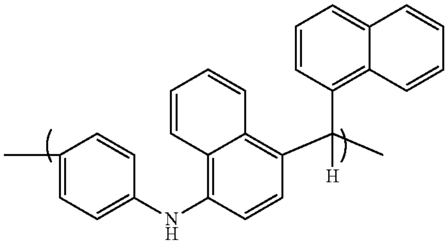

-continued
Formula (3-15)
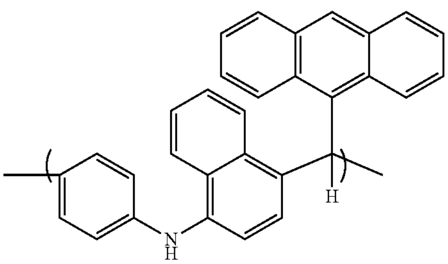
Formula (3-16)
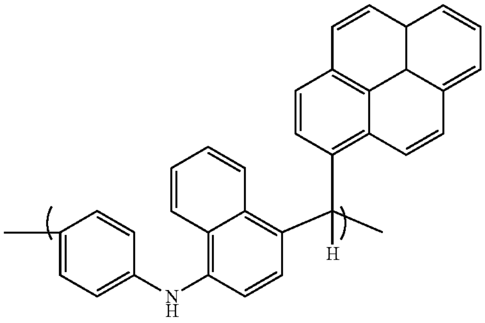
Formula (3-17)
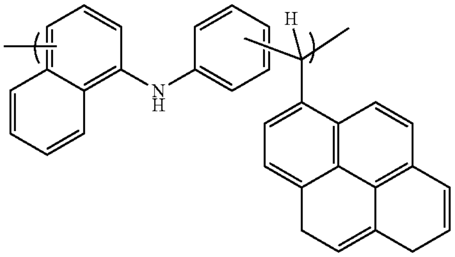
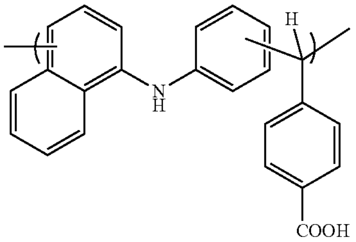
Formula (3-18)
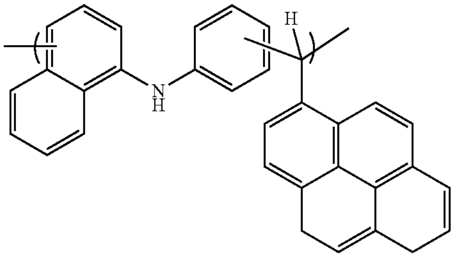
-continued
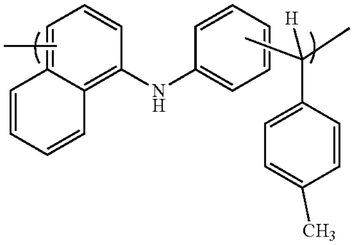
Formula (3-19)
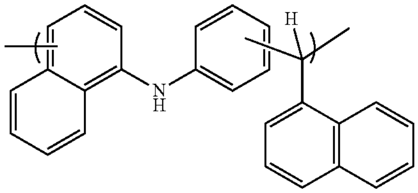
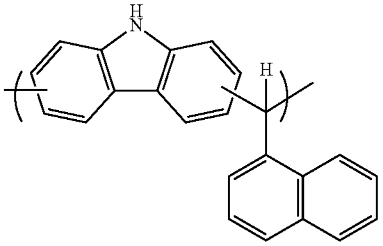
Formula (3-20)
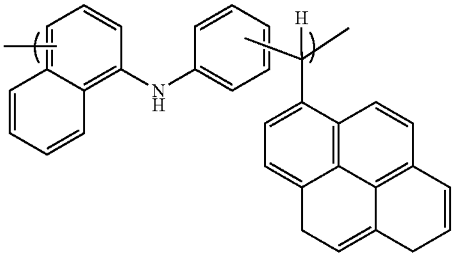
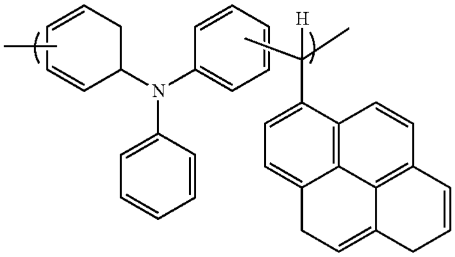
Formula (3-21)
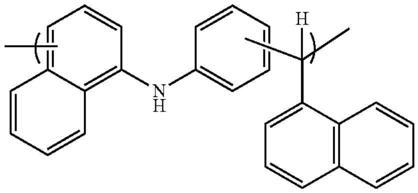

-continued

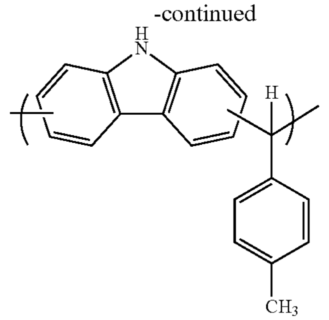

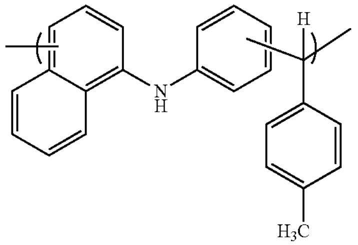

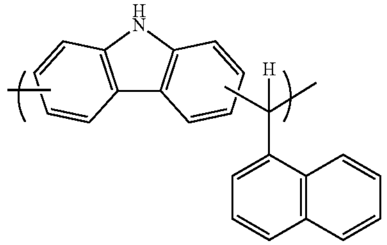

When a carbazole compound is used in the present invention, the carbazole compound may be, for example, carbazole, N-methylcarbazole, N-ethylcarbazole, 1,3,6,8-tetranitrocarbazole, 3,6-diaminocarbazole, 3,6-dibromo-9-ethylcarbazole, 3,6-dibromo-9-phenylcarbazole, 3,6-dibromocarbazole, 3,6-dichlorocarbazole, 3-amino-9-ethylcarbazole, 3-bromo-9-ethylcarbazole, 4,4'-bis(9H-carbazol-9-yl)biphenyl, 4-glycidylcarbazole, 4-hydroxycarbazole, 9-(1H-benzotriazol-1-ylmethyl)-9H-carbazole, 9-acetyl-3,6-diiodocarbazole, 9-benzoylcarbazole, 9-benzoylcarbazole-6-dicarboxaldehyde, 9-benzylcarbazole-3-carboxaldehyde, 9-methylcarbazole, 9-phenylcarbazole, 9-vinylcarbazole, carbazole potassium, carbazole-N-carbonyl chloride, N-ethylcarbazole-3-carboxaldehyde, or N-((9-ethylcarbazol-3-yl)methylene)-2-methyl-1-indolinylamine. These compounds may be used alone or in combination of two or more species.

When a triphenylamine compound is used in the present invention, the triphenylamine compound may be, for example, triphenylamine or substituted triphenylamine. The substituent may be the aforementioned one, such as a halogen atom, a nitro group, an amino group, a hydroxy group, a $C_{1-10}$ alkyl group, a $C_{2-10}$ alkenyl group, a $C_{6-40}$ aryl group, or any combination of these that may contain an ether bond, a ketone bond, or an ester bond.

Examples of the aldehyde compound used for the production of the polymer of the present invention include saturated aliphatic aldehydes such as formaldehyde, paraformaldehyde, acetaldehyde, propylaldehyde, butyraldehyde, isobutyraldehyde, valeraldehyde, capronaldehyde, 2-methylbutyraldehyde, hexylaldehyde, undecanaldehyde, 7-methoxy-3,7-dimethyloctylaldehyde, cyclohexanaldehyde, 3-methyl-2-butyraldehyde, glyoxal, malonaldehyde, succinaldehyde, glutaraldehyde, and adipaldehyde; unsaturated aliphatic aldehydes such as acrolein and methacrolein; heterocyclic aldehydes such as furfural, pyridinaldehyde, and thiophenaldehyde; and aromatic aldehydes such as benzaldehyde, naphthaldehyde, anthracenecarboxaldehyde, phenylbenzaldehyde, anisaldehyde, terephthalaldehyde, pyrenecarboxaldehyde, phenanthrylaldehyde, salicylaldehyde, phenylacetaldehyde, 3-phenylpropionaldehyde, tolylaldehyde, (N,N-dimethylamino) benzaldehyde, and acetoxybenzaldehyde. In particular, aromatic aldehydes are preferably used.

Examples of the ketone compound used for the production of the polymer of the present invention include diaryl ketones such as diphenyl ketone, phenyl naphthyl ketone, dinaphthyl ketone, phenyl tolyl ketone, ditolyl ketone, and 9-fluorenone.

The polymer used in the present invention is a novolac resin (corresponding to Formula (2)) prepared by condensation between an amine such as diarylamine and an aldehyde or a ketone.

In this condensation reaction, the aldehyde or the ketone may be used in an amount of 0.1 to 10 equivalents relative to 1 equivalent of the phenyl group of the amine such as diarylamine.

[Crosslinking Agent]

The resist underlayer film-forming composition of the present invention may contain a crosslinking agent component. The crosslinking agent is, for example, a melamine compound, a substituted urea compound, or a polymer thereof. The crosslinking agent is preferably a crosslinking agent having at least two crosslinkable substituents, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or butoxymethylated thiourea. A condensate of such a compound may also be used.

The aforementioned crosslinking agent may be a crosslinking agent having high thermal resistance. The crosslinking agent having high thermal resistance is preferably a compound containing a crosslinkable substituent having an aromatic ring (e.g., a benzene ring or a naphthalene ring) in the molecule.

Examples of the compound include a compound having a partial structure of the following Formula (4) and a polymer or oligomer having a repeating unit of the following Formula (5).

Formula (4)

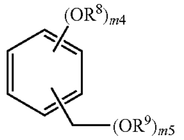

Formula (5)

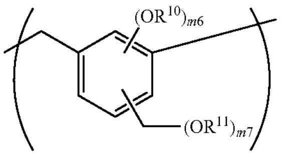

In the aforementioned Formulae (4) and (5), $R^8$, $R^9$, $R^{10}$, and $R^{11}$ are each a hydrogen atom or a $C_{1-10}$ alkyl group, and these alkyl groups may be the same as those exemplified above. In the aforementioned Formulae (4) and (5), m4 is an integer of 1 to 5, m5 is an integer of 1 to 5, (m4+m5) is an integer of 2 to 6, m6 is an integer of 1 to 3, m7 is an integer of 1 to 3, and (m6+m7) is an integer of 2 to 4.

Examples of the compound of Formula (4) and the polymer or oligomer of Formula (5) are as follows.

Formula (5-1)

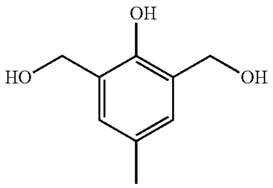

Formula (5-2)

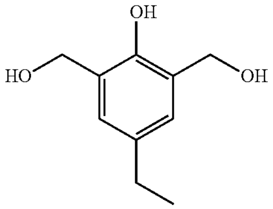

Formula (5-3)

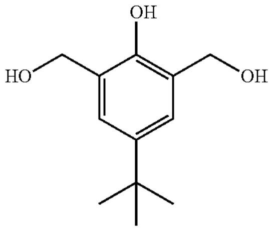

Formula (5-4)

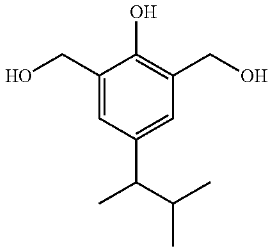

Formula (5-5)

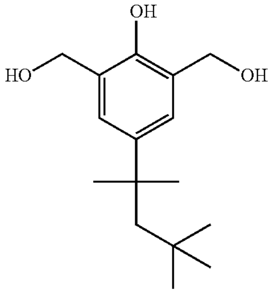

Formula (5-6)

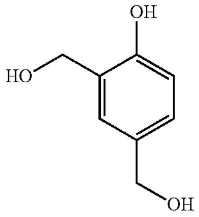

-continued

Formula (5-7)

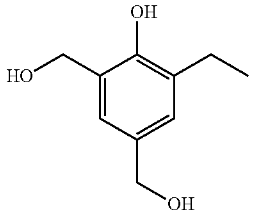

Formula (5-8)

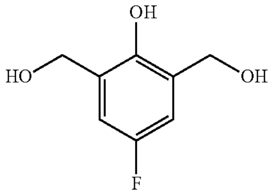

Formula (5-9)

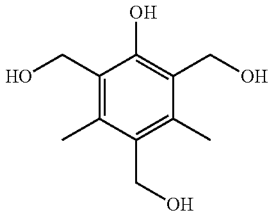

Formula (5-10)

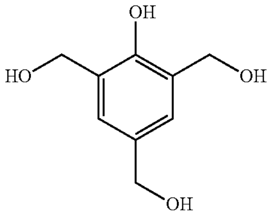

Formula (5-11)

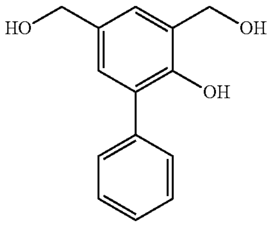

Formula (5-12)

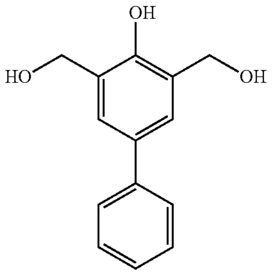

Formula (5-13)

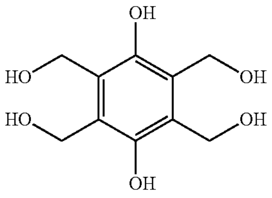

-continued

Formula (5-14)

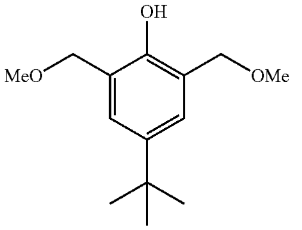

Formula (5-15)

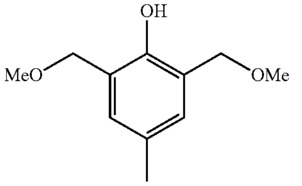

Formula (5-16)

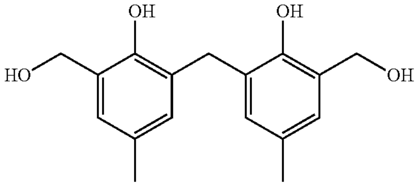

Formula (5-17)

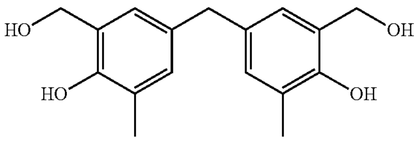

Formula (5-18)

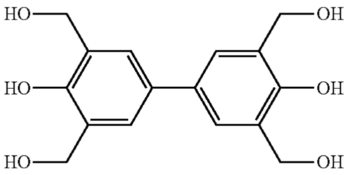

Formula (5-19)

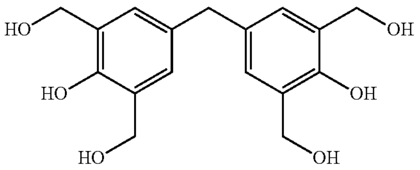

Formula (5-20)

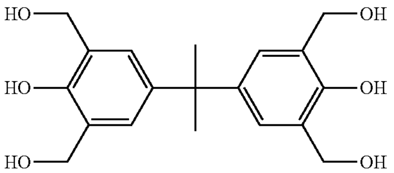

Formula (5-21)

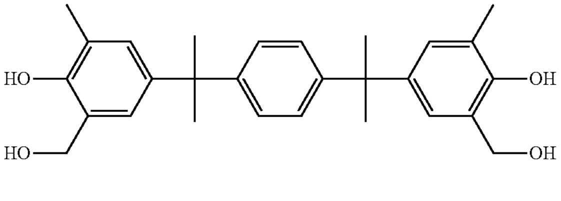

-continued

Formula (5-22)

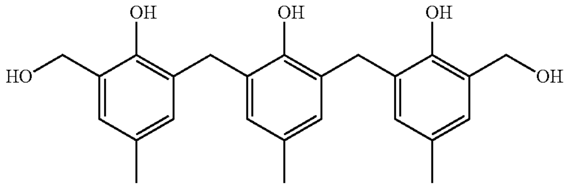

Formula (5-23)

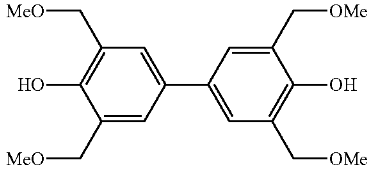

Formula (5-24)

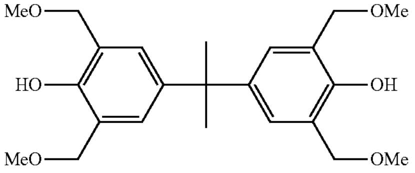

Formula (5-25)

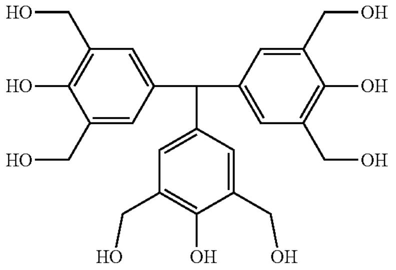

Formula (5-26)

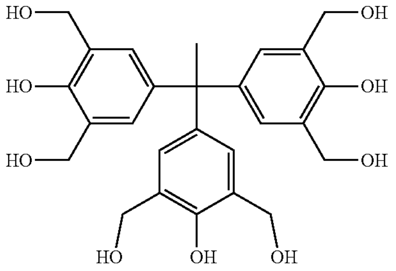

Formula (5-27)

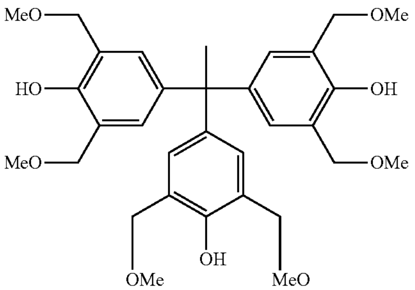

The aforementioned compounds can be obtained as products available from ASAHI YUKIZAI CORPORATION and Honshu Chemical Industry Co., Ltd. For example, among the aforementioned crosslinking agents, the compound of Formula (5-24) can be obtained as trade name TM-BIP-A available from ASAHI YUKIZAI CORPORATION.

The amount of the crosslinking agent added may vary depending on, for example, the type of a coating solvent used, the type of an underlying substrate used, the viscosity of a solution required, or the shape of a film required. The amount of the crosslinking agent is 0.001 to 80% by mass, preferably 0.01 to 50% by mass, more preferably 0.05 to 40% by mass, relative to the total solid content. Such a crosslinking agent may cause a crosslinking reaction by its self-condensation. When a crosslinkable substituent is present in any of the aforementioned polymers of the present invention, such a crosslinking agent may cause a crosslinking reaction with the crosslinkable substituent.

[Additional Additive]

If necessary, the resist underlayer film material of the present invention may further contain, for example, a rheology controlling agent, an adhesion aid, or a surfactant besides the aforementioned components.

The rheology controlling agent is added for the main purpose of improving the fluidity of the resist underlayer film-forming composition; in particular, the purpose of improving the uniformity of the film thickness of a resist underlayer film and improving the fillability of the resist underlayer film-forming composition into the hole in a baking process. Specific examples of the rheology controlling agent include phthalic acid derivatives, such as dimethyl phthalate, diethyl phthalate, diisobutyl phthalate, dihexyl phthalate, and butyl isodecyl phthalate; adipic acid derivatives, such as di-normal butyl adipate, diisobutyl adipate, diisooctyl adipate, and octyldecyl adipate; maleic acid derivatives, such as di-normal butyl maleate, diethyl maleate, and dinonyl maleate; oleic acid derivatives, such as methyl oleate, butyl oleate, and tetrahydrofurfuryl oleate; and stearic acid derivatives, such as normal butyl stearate and glyceryl stearate. Such a rheology controlling agent is incorporated in an amount of generally less than 30% by mass relative to the total solid content of the resist underlayer film material.

The adhesion aid is added for the main purpose of improving adhesion between a substrate or a resist and the resist underlayer film-forming composition; in particular, the purpose of preventing the resist from peeling off during development. Specific examples of the adhesion aid include chlorosilane compounds, such as trimethylchlorosilane, dimethylvinylchlorosilane, methyldiphenylchlorosilane, and chloromethyldimethylchlorosilane; alkoxysilane compounds, such as trimethylmethoxysilane, dimethyldiethoxysilane, methyldimethoxysilane, dimethylvinylethoxysilane, diphenyldimethoxysilane, and phenyltriethoxysilane; silazane compounds, such as hexamethyldisilazane, N,N-bis(trimethylsilyl)urea, dimethyltrimethylsilylamine, and trimethylsilylimidazole; silane compounds, such as vinyltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; urea such as 1,1-dimethylurea and 1,3-dimethylurea; and thiourea compounds. Such an adhesion aid is incorporated in an amount of generally less than 5% by mass, preferably less than 2% by mass, relative to the total solid content of the resist underlayer film material.

The resist underlayer film material of the present invention may contain a surfactant for further improving the coatability against an uneven surface without causing, for example, pinholes or striations. Examples of the surfactant include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylallyl ethers, such as polyoxyethylene octylphenol ether and polyoxyethylene nonylphenol ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as EFTOP EF301, EF303, and EF352 (trade name, available from Tohkem Products Corporation), MEGAFACE F171, F173, and R-30 (trade name, available from DIC Corporation), Fluorad FC430 and FC431 (trade name, available from Sumitomo 3M Limited), Asahi Guard AG710 and SURFLON S-382, SC101, SC102, SC103, SC104, SC105, and SC106 (trade name, available from Asahi Glass Co., Ltd.); and Organosiloxane Polymer KP341 (available from Shin-Etsu Chemical Co., Ltd.). The amount of such a surfactant is generally 2.0% by mass or less, preferably 1.0% by mass or less, relative to the total solid content of the resist underlayer film material of the present invention. These surfactants may be added alone or in combination of two or more species.

[Solvent]

Examples of the solvent that can be used for dissolving, for example, the aforementioned polymer, crosslinking agent component, and crosslinking catalyst in the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used alone or in combination of two or more species.

Furthermore, high-boiling-point solvents such as propylene glycol monobutyl ether and propylene glycol monobutyl ether acetate may be used in combination. Of these solvents, for example, propylene glycol monomethyl ether, propylene glycol monomethyl ether acetate, ethyl lactate, butyl lactate, and cyclohexanone are preferred in view of an improvement of leveling property.

Next will be described a method for forming a planarization film from the resist underlayer film-forming composition of the present invention. In this case, the resist underlayer film is an uneven substrate coating film (planarization film), and the resist underlayer film-forming composition is an uneven substrate coating composition. Specifically, the resist underlayer film-forming composition is applied onto a substrate used for the production of a precise integrated circuit element (e.g., a transparent substrate, such as a silicon/silicon dioxide coating, a glass substrate, or an ITO substrate) by an appropriate applying method using, for example, a spinner or a coater. Thereafter, the composition is baked (heated) to thereby form a coating film. Thus, a coated substrate is produced by a method including a step (i)

of applying the resist underlayer film-forming composition to an uneven substrate, and a step (ii) of heating the composition applied in the step (i).

When a spinner is used for application of the composition, the application can be performed at a spinner rotation speed of 100 to 5,000 for 10 to 180 seconds.

The aforementioned substrate may have an open area (non-patterned area) and a patterned area of DENSE (dense) and ISO (coarse), and the pattern may have an aspect ratio of 0.1 to 10 or 0.1 to 100.

The "non-patterned area" refers to an area where a pattern (e.g., a hole or a trench structure) is absent on the substrate. "DENSE (dense)" refers to an area where patterns are densely present on the substrate, and "ISO (coarse)" refers to an area where interpattern distance is large and patterns are scattered on the substrate. The aspect ratio of a pattern is the ratio of the depth of the pattern to the width of the pattern. The pattern depth is generally several hundreds of nm (e.g., about 100 to 300 nm). DENSE (dense) is an area where patterns of about several tens of nm (e.g., 30 to 80 nm) are densely present at intervals of about 100 nm. ISO (coarse) is an area where patterns of several hundreds of nm (e.g., about 200 to 1,000 nm) are scattered.

The resist underlayer film (planarization film) preferably has a thickness of 0.01 μm to 3.0 μm. In the step (ii), the heating is preferably performed at a temperature of 100° C. to 300° C. or 150° C. to 250° C. An acid is generated and curing reaction occurs at a temperature falling within such a range, to thereby achieve solvent resistance. The heating time is preferably 10 seconds to 5 minutes or 30 seconds to 2 minutes. This heating, which may be performed once, or performed once at a low temperature and then once at a high temperature, causes the reflow of the resist underlayer film-forming composition to thereby form a flat resist underlayer film (planarization film).

In the thus-formed resist underlayer film (planarization film), the Bias (difference in coating level) is preferably zero between the open area and the patterned area. The planarization can be performed so that the Bias falls within a range of 1 nm to 50 nm or 1 nm to 25 nm. The Bias between the open area and the DENSE area is about 15 nm to 20 nm, and the Bias between the open area and the ISO area is about 1 nm to 10 nm.

The resist underlayer film (planarization film) obtained from the present invention can be coated with a resist film, and the resist film can be exposed to light and developed by lithography, to thereby form a resist pattern. The substrate can be processed with the resist pattern.

A resist can be applied onto the resist underlayer film, and the resist can be irradiated with light or electron beams through a predetermined mask, followed by development, rinsing, and drying, to thereby form a resist pattern having a favorable shape. If necessary, post exposure bake (PEB) may be performed after the irradiation with light or electron beams. The resist underlayer film at a portion where the resist film has been developed and removed in the aforementioned step can be removed by dry etching, to thereby form a desired pattern on the substrate.

The resist used in the present invention is a photoresist or an electron beam resist.

In the present invention, the photoresist applied onto the resist underlayer film may be either of negative and positive photoresists. Examples of the photoresist include a positive photoresist formed of a novolac resin and a 1,2-naphthoquinone diazide sulfonic acid ester; a chemically amplified photoresist formed of a binder having a group that decomposes with an acid to thereby increase the alkali dissolution rate and a photoacid generator; a chemically amplified photoresist formed of an alkali-soluble binder, a low-molecular-weight compound that decomposes with an acid to thereby increase the alkali dissolution rate of the photoresist, and a photoacid generator; a chemically amplified photoresist formed of a binder having a group that decomposes with an acid to thereby increase the alkali dissolution rate, a low-molecular-weight compound that decomposes with an acid to thereby increase the alkali dissolution rate of the photoresist, and a photoacid generator; and a photoresist having an Si atom-containing skeleton. Specific examples of the photoresist include trade name APEX-E available from Rohm and Haas Company.

In the present invention, the electron beam resist applied onto the resist underlayer film is, for example, a composition containing a resin having an Si—Si bond in a main chain and an aromatic ring at a terminal, and an acid generator that generates an acid through irradiation with electron beams; or a composition containing poly(p-hydroxystyrene) wherein a hydroxy group is substituted with an N-carboxyamine-containing organic group, and an acid generator that generates an acid through irradiation with electron beams. In the latter electron beam resist composition, an acid generated from the acid generator through irradiation with electron beams reacts with an N-carboxyaminoxy group at a side chain of the polymer, and the polymer side chain decomposes into a hydroxy group, exhibits alkali solubility, and dissolves in an alkaline developer, to thereby form a resist pattern. Examples of the acid generator that generates an acid through irradiation with electron beams include halogenated organic compounds, such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts, such as triphenylsulfonium salts and diphenyliodonium salts; and sulfonic acid esters, such as nitrobenzyl tosylate and dinitrobenzyl tosylate.

The exposure light used for the aforementioned photoresist is actinic rays, such as near-ultraviolet rays, far-ultraviolet rays, or extreme-ultraviolet rays (e.g., EUV, wavelength: 13.5 nm); for example, light having a wavelength of 248 nm (KrF laser beam), 193 nm (ArF laser beam), or 172 nm. No particular limitation is imposed on the usable photoirradiation method, so long as the method can generate an acid from a photoacid generator in the resist film. The dose of the exposure light is 1 to 5,000 $mJ/cm^2$, or 10 to 5,000 $mJ/cm^2$, or 10 to 1,000 $mJ/cm^2$.

The electron beam resist can be irradiated with electron beams by using, for example, an electron beam irradiation apparatus.

Examples of the developer for the resist film having the resist underlayer film formed from the resist underlayer film-forming composition of the present invention include aqueous solutions of alkalis, for example, inorganic alkalis, such as sodium hydroxide, potassium hydroxide, sodium carbonate, sodium silicate, sodium metasilicate, and aqueous ammonia, primary amines, such as ethylamine and n-propylamine, secondary amines, such as diethylamine and di-n-butylamine, tertiary amines, such as triethylamine and methyldiethylamine, alcoholamines, such as dimethylethanolamine and triethanolamine, quaternary ammonium salts, such as tetramethylammonium hydroxide, tetraethylammonium hydroxide, and choline, and cyclic amines, such as pyrrole and piperidine. The developer to be used may be prepared by addition of an appropriate amount of an alcohol (e.g., isopropyl alcohol) or a surfactant (e.g., a nonionic surfactant) to any of the aforementioned aqueous alkali solutions. Among these developers, quaternary ammonium salts are preferred, and tetramethylammonium hydroxide and choline are more preferred.

An organic solvent may be used as the developer. Examples of the organic solvent include methyl acetate, butyl acetate, ethyl acetate, isopropyl acetate, amyl acetate, isoamyl acetate, ethyl methoxyacetate, ethyl ethoxyacetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Such a developer may further contain, for example, a surfactant. The development is performed under appropriately determined conditions; i.e., a temperature of 5 to 50° C. and a time of 10 to 600 seconds.

In the present invention, a semiconductor device can be produced through a step of forming a resist underlayer film on a semiconductor substrate from the resist underlayer film-forming composition; a step of forming a resist film on the resist underlayer film; a step of irradiating the resist film with light or electron beams, and developing the resist film, to thereby form a resist pattern; a step of etching the resist underlayer film with the resist pattern; and a step of processing the semiconductor substrate with the patterned resist underlayer film.

In the future, the formation of a finer resist pattern will cause a problem in terms of resolution and a problem in that the resist pattern collapses after development, and a decrease in the thickness of a resist will be demanded. Thus, it is difficult to form a resist pattern having a thickness sufficient for processing of a substrate. This requires a process for imparting a mask function, during the substrate processing, not only to the resist pattern, but also to a resist underlayer film that is formed between the resist film and the semiconductor substrate to be processed. The resist underlayer film required for such a process is not a conventional resist underlayer film having a high etching rate, but a resist underlayer film having a selection ratio of dry etching rate similar to that of the resist film, a resist underlayer film having a smaller selection ratio of dry etching rate than the resist film, or a resist underlayer film having a smaller selection ratio of dry etching rate than the semiconductor substrate. Such a resist underlayer film may be provided with an anti-reflective performance; i.e., the film may also have the function of a conventional anti-reflective coating.

Meanwhile, in order to obtain a finer resist pattern, a process for making a resist pattern and a resist underlayer film thinner than the pattern width during the resist development by dry etching of the resist underlayer film, has started to be used. The resist underlayer film required for such a process is not a conventional anti-reflective coating having a high etching rate, but a resist underlayer film having a selection ratio of dry etching rate similar to that of the resist film. Such a resist underlayer film may be provided with an anti-reflective performance; i.e., the film may also have the function of a conventional anti-reflective coating.

In the present invention, after formation of the resist underlayer film of the present invention on a substrate, a resist may be applied directly to the resist underlayer film, or if necessary, the resist may be applied after formation of one to several layers of coating material on the resist underlayer film. This process reduces the pattern width of the resist film. Thus, even when the resist film is thinly applied for prevention of pattern collapse, the substrate can be processed with an appropriately selected etching gas.

Specifically, a semiconductor device can be produced through a step of forming a resist underlayer film on a semiconductor substrate from the resist underlayer film-forming composition; a step of forming, on the resist underlayer film, a hard mask from a coating material containing, for example, a silicon component or a hard mask (e.g., from silicon nitride oxide) by vapor deposition; a step of forming a resist film on the hard mask; a step of forming a resist pattern by irradiation of the resist film with light or electron beams and development; a step of etching the hard mask with the resist pattern by using a halogen-containing gas; a step of etching the resist underlayer film with the patterned hard mask by using an oxygen-containing gas or a hydrogen-containing gas; and a step of processing the semiconductor substrate with the patterned resist underlayer film by using a halogen-containing gas.

In the resist underlayer film-forming composition of the present invention, in consideration of the effect of the formed resist underlayer film as an anti-reflective coating, there is no diffusing substance in the photoresist during heating and drying due to the light-absorbing moiety being incorporated into the skeleton. Further, since the light-absorbing moiety has sufficiently high light absorption performance, a high anti-reflective effect is expected.

The resist underlayer film-forming composition of the present invention has high thermal stability, and thus can prevent contamination of an upper-layer film caused by a decomposed substance during baking. Also, the composition can provide a temperature margin in a baking step.

In the resist underlayer film-forming composition of the present invention, depending on process conditions, the formed resist underlayer film can be used as a film having the function of preventing light reflection and the function of preventing the interaction between the substrate and the photoresist or preventing the adverse effect, on the substrate, of a material used for the photoresist or a substance generated during the exposure of the photoresist to light.

EXAMPLES

Preparation Example 1

A resist underlayer film-forming composition was prepared by dissolving 1.00 g of the polymer of Formula (6), 0.20 g of 3,3',5,5'-tetramethoxymethyl-4,4'-bisphenol serving as a crosslinking agent, 0.020 g of pyridinium trifluoromethanesulfonate serving as an acid catalyst, and 0.002 g of a surfactant (product name: MEGAFACE [trade name] R-30N, fluorine-containing surfactant, available from DIC Corporation) in 4.88 g of propylene glycol monomethyl ether and 4.88 g of propylene glycol monomethyl ether acetate.

(6)

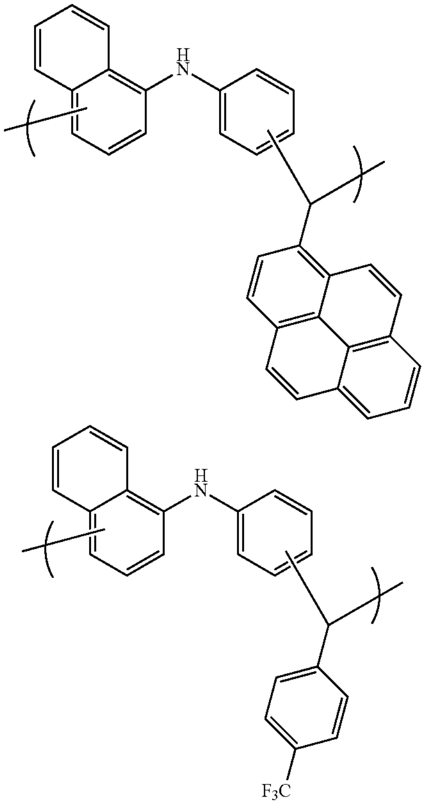

Preparation Example 2

A resist underlayer film-forming composition was prepared by dissolving 1.00 g of the polymer of Formula (6), 0.20 g of 3,3',5,5'-tetramethoxymethyl-4,4'-bisphenol serving as a crosslinking agent, 0.020 g of pyridinium-p-phenolsulfonate and 0.020 g of pyridinium trifluoromethanesulfonate serving as acid catalysts, and 0.002 g of a surfactant (product name: MEGAFACE [trade name] R-30N, fluorine-containing surfactant, available from DIC Corporation) in 4.88 g of propylene glycol monomethyl ether and 4.88 g of propylene glycol monomethyl ether acetate.

Preparation Example 3

A resist underlayer film-forming composition was prepared by dissolving 1.00 g of the polymer of Formula (6), 0.20 g of 3,3',5,5'-tetramethoxymethyl-4,4'-bisphenol serving as a crosslinking agent, 0.020 g of pyridinium-p-phenolsulfonate and 0.008 g of pyridinium trifluoromethanesulfonate serving as acid catalysts, and 0.002 g of a surfactant (product name: MEGAFACE [trade name] R-30N, fluorine-containing surfactant, available from DIC Corporation) in 4.88 g of propylene glycol monomethyl ether and 4.88 g of propylene glycol monomethyl ether acetate.

Preparation Example 4

A resist underlayer film-forming composition was prepared by dissolving 1.00 g of the polymer of Formula (6), 0.20 g of 3,3',5,5'-tetramethoxymethyl-4,4'-bisphenol serving as a crosslinking agent, 0.020 g of pyridinium-p-phenolsulfonate and 0.020 g of trifluoromethanesulfonic acid serving as acid catalysts, and 0.002 g of a surfactant (product name: MEGAFACE [trade name] R-30N, fluorine-containing surfactant, available from DIC Corporation) in 4.88 g of propylene glycol monomethyl ether and 4.88 g of propylene glycol monomethyl ether acetate.

Preparation Example 5

A resist underlayer film-forming composition was prepared by dissolving 1.00 g of the polymer of Formula (6), 0.20 g of 3,3',5,5'-tetramethoxymethyl-4,4'-bisphenol serving as a crosslinking agent, 0.020 g of pyridinium-p-phenolsulfonate and 0.008 g of trifluoromethanesulfonic acid serving as acid catalysts, and 0.002 g of a surfactant (product name: MEGAFACE [trade name] R-30N, fluorine-containing surfactant, available from DIC Corporation) in 4.88 g of propylene glycol monomethyl ether and 4.88 g of propylene glycol monomethyl ether acetate.

Comparative Preparation Example 1

A resist underlayer film-forming composition was prepared by dissolving 1.00 g of the polymer of Formula (6), 0.20 g of 3,3',5,5'-tetramethoxymethyl-4,4'-bisphenol serving as a crosslinking agent, 0.020 g of pyridinium-p-phenolsulfonate serving as an acid catalyst, and 0.002 g of a surfactant (product name: MEGAFACE [trade name] R-30N, fluorine-containing surfactant, available from DIC Corporation) in 4.88 g of propylene glycol monomethyl ether and 4.88 g of propylene glycol monomethyl ether acetate.

(Test for Elution in Photoresist Solvent)

Each of the resist underlayer film-forming compositions prepared in Preparation Examples 1 to 5 and Comparative Preparation Example 1 was applied onto a silicon wafer with a spin coater. The composition was baked on a hot plate at 240° C. for one minute and then baked at 400° C. for one minute, to thereby form a resist underlayer film (thickness: 0.34 μm). The resist underlayer film was immersed in solvents used for a resist; i.e., propylene glycol monomethyl ether and propylene glycol monomethyl ether acetate, and the film was found to be insoluble in these solvents.

(Evaluation of Amount of Sublimate)

A sublimate generated from a resist underlayer film contains, for example, a crosslinking agent, a polymer degradation product, and an oligomer. The amount of such a sublimate was measured with a sublimate amount measuring apparatus described in WO 2007/111147 pamphlet. Firstly, each of the resist underlayer film-forming compositions prepared in Preparation Examples 1 to 5 and Comparative Preparation Example 1 was applied onto a silicon wafer substrate having a diameter of 4 inches with a spin coater so as to achieve a film thickness of 50 nm. The wafer coated with the resist underlayer film was set in the aforementioned sublimate amount measuring apparatus integrated with a hot plate, and then baked for 120 seconds. A sublimate was collected with a QCM (quartz crystal microbalance) sensor; i.e., a quartz oscillator having an electrode formed thereon. The QCM sensor can measure a minute change in mass by utilizing the property that when a sublimate adheres to the surface (electrode) of the quartz oscillator, the frequency of the quartz oscillator changes in accordance with the mass of the sublimate.

Detailed measurement procedure is as follows.

Comparative Example 1 and Examples 1 to 5

The hot plate of the sublimate amount measuring apparatus was heated to 240° C., and the flow rate of a pump was adjusted to 1 $m^3/s$. During the initial 60 seconds, the apparatus was allowed to stand for stabilization thereof. Immediately thereafter, the wafer coated with the resist underlayer film was rapidly placed on the hot plate through a slide inlet. A sublimate was collected from the time 60 seconds to the time 180 seconds (for a duration of 120 seconds). During the measurement, no nozzle was attached to a flow attachment (i.e., a detection section) which connects a collection funnel section and the QCM sensor of the sublimate amount measuring apparatus. Thus, airflow flows without being throttled through a flow path (diameter: 32 mm) of a chamber unit disposed 30 mm away from the sensor (i.e., a quartz oscillator). The electrode of the QCM sensor was formed of a material containing silicon and aluminum as main components (AlSi). The diameter of the quartz oscillator (i.e., sensor diameter) was 14 mm, the diameter of the front surface electrode of the quartz oscillator was 5 mm, and the resonance frequency was 9 MHz. The thus-measured change in frequency was converted into the corresponding mass (gram) by use of the specific frequency of the quartz oscillator, to thereby elucidate the relationship between the elapsed time and the amount of a sublimate per wafer coated with the resist underlayer film. The initial 60 seconds correspond to the period of time during which the apparatus was allowed to stand (without setting of the wafer) for stabilization of the apparatus. Thus, the amount of the sublimate on the wafer is obtained from the measurement value from the time 60 seconds to the time 180 seconds during which the wafer was placed on the hot plate. Table 1 shows the sublimate amount of the resist underlayer film determined with the apparatus as a physical ratio of the sublimate. The ratio of the sublimate is represented by a value normalized with respect to the amount of the sublimate (taken as 1) generated from the resist underlayer film of Comparative Example 1.

Comparative Example 2 and Examples 6 to 9

The hot plate of the sublimate amount measuring apparatus was heated to 240° C., and the flow rate of a pump was adjusted to 1 $m^3/s$. During the initial 60 seconds, the apparatus was allowed to stand for stabilization thereof. Immediately thereafter, the wafer coated with the resist underlayer film was rapidly placed on the hot plate through a slide inlet, and then baked for 180 seconds. Thereafter, the wafer coated with the resist underlayer film was rapidly transferred to the hot plate preliminarily heated to 300° C. and stabilized in a manner similar to that described above, and then a sublimate was collected from the time 60 seconds to the time 180 seconds (for a duration of 120 seconds). The sublimate amount measuring apparatus is the same as in Example 1. Table 2 shows the sublimate amount of the resist underlayer film determined with the apparatus as a physical ratio of the sublimate. The ratio of the sublimate is represented by a value normalized with respect to the amount of the sublimate (taken as 1) generated from the resist underlayer film of Comparative Example 2.

TABLE 1

| Sublimate generated from resist underlayer film | | |
|---|---|---|
| Resist underlayer film (composition) | Baking temperature | Sublimate amount |
| Comparative Example 1 (Comparative Preparation Example 1) | 240° C. | 1.0 |
| Example 1 (Preparation Example 1) | 240° C. | 0.7 |
| Example 2 (Preparation Example 2) | 240° C. | 0.6 |
| Example 3 (Preparation Example 3) | 240° C. | 0.7 |
| Example 4 (Preparation Example 4) | 240° C. | 0.8 |
| Example 5 (Preparation Example 5) | 240° C. | 0.8 |

TABLE 2

| Sublimate generated from resist underlayer film after baking at 240° C. | | |
|---|---|---|
| Resist underlayer film (composition) | Baking temperature | Sublimate amount |
| Comparative Example 2 (Comparative Preparation Example 1) | 300° C. | 1.0 |
| Example 6 (Preparation Example 2) | 300° C. | 0.5 |
| Example 7 (Preparation Example 3) | 300° C. | 0.7 |
| Example 8 (Preparation Example 4) | 300° C. | 0.8 |
| Example 9 (Preparation Example 5) | 300° C. | 0.9 |

As shown in Table 1, the comparison in sublimate amount between the Comparative Example and the Examples indicated that the use of the acid catalyst A of the present invention can effectively reduce the amount of a sublimate as compared with the case of Comparative Example 1 even when, in particular, the baking temperature is lower than 250° C.

As shown in Table 2, in Examples 6 to 9 wherein the underlayer film contained two types of acids (i.e., the acid catalysts A and B), even when baking was performed at a high temperature after baking at a low temperature, the sublimate amount was reduced as compared with the case of Comparative Example 2 wherein the underlayer film contained only the acid catalyst B.

These results indicate that addition of two types of acids (i.e., an organic acid having a fluoroalkyl group or an organic acid salt having a fluoroalkyl group and an arylsulfonic acid salt having a hydroxy group) is effective for reducing the amount of a sublimate during two-step baking and formation of a resist underlayer film regardless of the baking temperature.

The invention claimed is:

1. A resist underlayer film-forming composition comprising a polymer resin and an acid catalyst A, wherein the polymer resin comprises a polymer containing a unit structure (A) of Formula (2):

Formula (2)

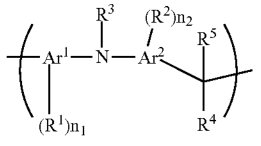

wherein each of $Ar^1$ and $Ar^2$ is a benzene ring or a naphthalene ring, each of $R^1$ and $R^2$ is a substituent of a hydrogen atom on the corresponding ring, and is selected from the group consisting of a halogen atom, a nitro group, an amino group, a hydroxy group, a $C_{1-10}$ alkyl group, a $C_{2-10}$ alkenyl group, a $C_{6-40}$ aryl group, and any combination of these, and each of the alkyl group, the alkenyl group, and the aryl group is an organic group that may contain an ether bond, a ketone bond, or an ester bond, $R^3$ is selected from the group consisting of a hydrogen atom, a $C_{1-10}$ alkyl group, a $C_{2-10}$ alkenyl group, a $C_{6-40}$ aryl group, and any combination of these, and each of the alkyl group, the alkenyl group, and the aryl group is an organic group that may contain an ether bond, a ketone bond, or an ester bond, $R^4$ is selected from the group consisting of a $C_{6-40}$ aryl group and a heterocyclic group, and each of the aryl group and the heterocyclic group is an organic group substitutable with a halogen atom, a nitro group, an amino group, a $C_{1-10}$ alkyl group, a $C_{1-10}$ alkoxy group, a $C_{6-40}$ aryl group, a formyl group, a carboxyl group, or a hydroxy group, $R^5$ is selected from the group consisting of a hydrogen atom, a $C_{1-10}$ alkyl group, a $C_{6-40}$ aryl group, and a heterocyclic group, each of the alkyl group, the aryl group, and the heterocyclic group is an organic group substitutable with a halogen atom, a nitro group, an amino group, or a hydroxy group, $R^4$ and $R^5$ may form a ring together with the carbon atom to which they are bonded, and each of $n_1$ and $n_2$ is an integer of 0 to 3, and wherein the acid catalyst A is an organic acid having a fluoroalkyl group or an organic acid salt having a fluoroalkyl group.

2. The resist underlayer film-forming composition according to claim 1, wherein the acid catalyst A is an organic acid or an organic acid salt having three or more fluorine atoms in one molecule.

3. The resist underlayer film-forming composition according to claim 1, wherein the acid catalyst A is a sulfonic acid or a sulfonic acid salt.

4. The resist underlayer film-forming composition according to claim 1, wherein the organic acid salt having a fluoroalkyl group is a pyridinium salt.

5. The resist underlayer film-forming composition according to claim 1, wherein the acid catalyst A is a trifluoromethanesulfonic acid or a trifluoromethanesulfonic acid salt.

6. The resist underlayer film-forming composition according to claim 1, wherein the composition further comprises an acid catalyst B, and the acid catalyst B is an arylsulfonic acid salt compound having a hydroxy group of the following Formula (1):

Formula (1)

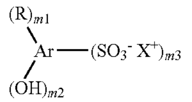

wherein Ar is an aromatic carbon ring, and the aromatic carbon ring is a benzene ring or a polycondensed ring composed of condensed benzene rings; R is each a substituent of a hydrogen atom on the aromatic carbon ring, and is a nitro group, an amino group, a carboxyl group, a halogen atom, a $C_{1-10}$ alkoxy group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group composed of any combination of these; m1 is an integer of 0 to (2+2n); m2 and m3 are each an integer of 1 to (3+2n); (m1+m2+m3) is an integer of 2 to (4+2n); the number of benzene rings of the polycondensed ring is an integer of 2 to 6; and $X^+$ is $NH_4^+$, a primary ammonium ion, a secondary ammonium ion, a tertiary ammonium ion, a quaternary ammonium ion, a sulfonium ion, or an iodonium cation.

7. The resist underlayer film-forming composition according to claim 6, wherein Ar is a benzene ring.

8. The resist underlayer film-forming composition according to claim 6, wherein $X^+$ is an ammonium ion.

9. The resist underlayer film-forming composition according to claim 6, wherein R is a methyl group or a carboxyl group.

10. The resist underlayer film-forming composition according to claim 6, wherein m1 is 0, and m2 and m3 are each 1.

11. The resist underlayer film-forming composition according to claim 1, wherein the composition further comprises a crosslinking agent.

12. A resist underlayer film formed from the resist underlayer film-forming composition according to claim 1.

13. A method for forming a resist pattern used for semiconductor production, the method comprising a step of applying the resist underlayer film-forming composition according to claim 1 onto a semiconductor substrate, and a step of baking the composition to thereby form a resist underlayer film.

14. The method for forming a resist pattern according to claim 13, wherein the step of baking is a two-stage baking step in which the composition is baked at 250° C. or lower, and then heated to a temperature higher than 250° C. and further baked.

15. A method for producing a semiconductor device comprising a step of forming, on a semiconductor substrate, a resist underlayer film from the resist underlayer film-forming composition according to claim 1;

a step of forming a resist film on the resist underlayer film;

a step of irradiating the resist film with light or electron beams, and then developing the resist film, to thereby form a resist pattern;

a step of etching the resist underlayer film with the formed resist pattern; and a step of processing the semiconductor substrate with the patterned resist underlayer film.

16. A method for producing a semiconductor device comprising a step of forming, on a semiconductor substrate, a resist underlayer film from the resist underlayer film-forming composition according to claim 1;

a step of forming a hard mask on the resist underlayer film;

a step of forming a resist film on the hard mask;

a step of irradiating the resist film with light or electron beams, and then developing the resist film, to thereby form a resist pattern;

a step of etching the hard mask with the formed resist pattern;

a step of etching the resist underlayer film with the patterned hard mask; and a step of processing the semiconductor substrate with the patterned resist underlayer film.

* * * * *